(12) United States Patent
Ozawa et al.

(10) Patent No.: US 7,884,463 B2
(45) Date of Patent: Feb. 8, 2011

(54) WIRING BOARD, SEMICONDUCTOR DEVICE AND SEMICONDUCTOR ELEMENT

(75) Inventors: Takashi Ozawa, Nagano (JP); Hitoshi Sato, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/626,037

(22) Filed: Nov. 25, 2009

(65) Prior Publication Data

US 2010/0127370 A1    May 27, 2010

(51) Int. Cl.
*H01L 23/495* (2006.01)
(52) U.S. Cl. ............... 257/690; 257/692; 257/774; 257/E23.023
(58) Field of Classification Search .......... 257/676, 257/778, 737, E23.023, 690, 692
See application file for complete search history.

(56) References Cited

U.S. PATENT DOCUMENTS 6,335,566 B1 * 1/2002 Hirashima et al. .......... 257/686
6,734,535 B1 * 5/2004 Hashimoto ............... 257/668
2009/0309210 A1 * 12/2009 Danno .................... 257/690

FOREIGN PATENT DOCUMENTS

JP    10-284538    10/1998

* cited by examiner

*Primary Examiner*—Roy K Potter
(74) *Attorney, Agent, or Firm*—Rankin, Hill & Clark LLP

(57) ABSTRACT

On a semiconductor element loading face, wiring patterns are drawn out from those formed in the vicinity of the edge of the semiconductor element of the loading pads formed to correspond to the electrode terminals of the semiconductor element, and connected to via pads formed in the vicinity of the edge of the semiconductor element loading face; area pads constructed of the loading pads corresponding to the electrode terminals formed in the central region of the semiconductor element and its vicinity are electrically connected to external connecting terminal pads formed in the central region on the other side of the wiring board and its vicinity, through the nearest area pad vias encircled by the external connecting terminal pads and passing through the wiring board and the wiring patterns; and a plurality of the loading pads constituting the area pads commonly use one of the area pad vias.

9 Claims, 8 Drawing Sheets

FIG. 6
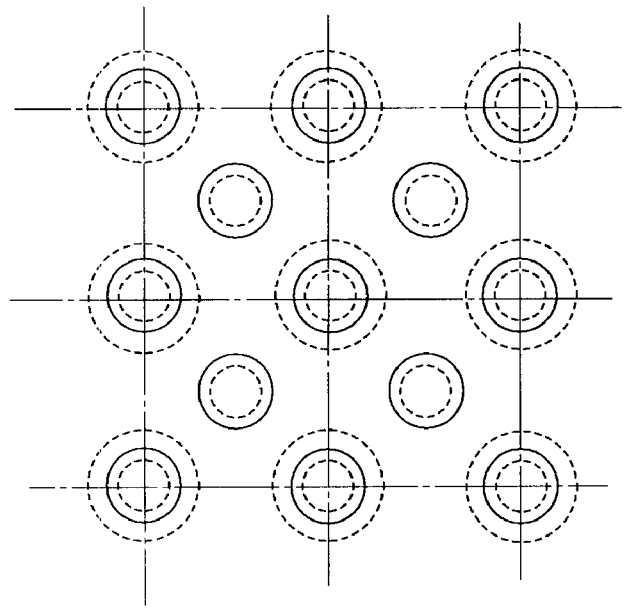
FIG. 7A
FIG. 7B
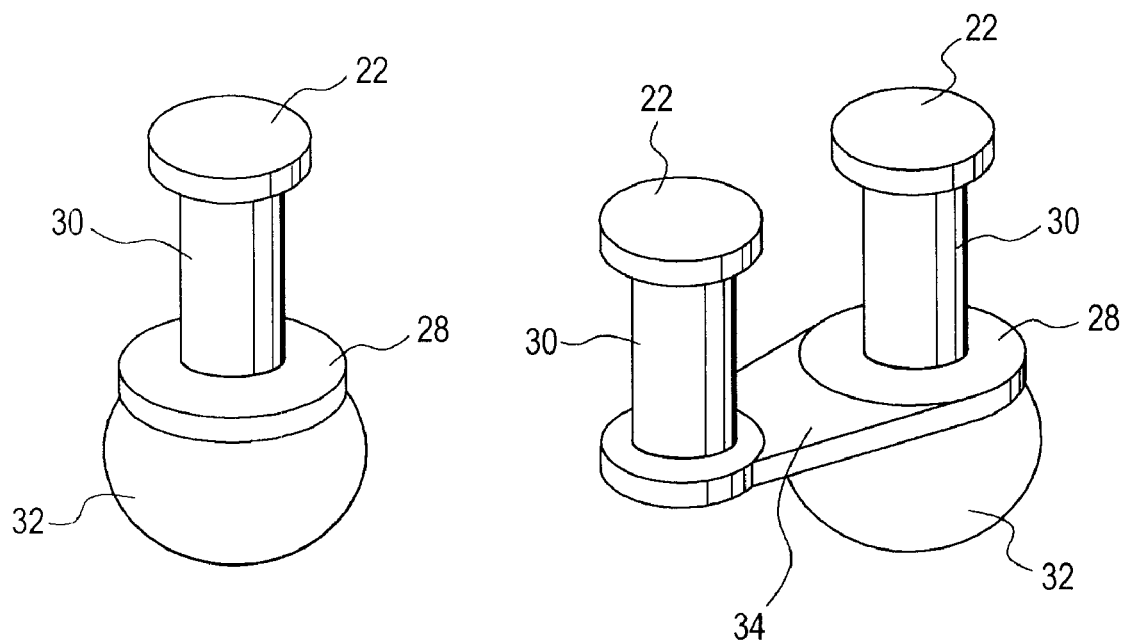

WIRING BOARD, SEMICONDUCTOR DEVICE AND SEMICONDUCTOR ELEMENT

CROSS-REFERENCE TO RELATED APPLICATION

This application is based on and claims priority under 35 U.S.C. §119 from Japanese Patent Application No. 2008-299052 filed on Nov. 25, 2008.

BACKGROUND OF THE INVENTION

1. Technical Field

This invention relates to a wiring board, a semiconductor device and a semiconductor element, and more particularly to a wiring board on which a semiconductor element with electrode terminals on the entire face of the one side thereof is loaded, a semiconductor device with the semiconductor element loaded on the wiring board, and a semiconductor element loaded on the wiring board.

2. Related Art

On the one side of a wiring board 100 with a conventional semiconductor element 102 loaded thereon as shown in FIG. 12A, formed is a semiconductor element loading face having a wider area than that of the semiconductor element 102 to be loaded. On the semiconductor element loading face, pads 104, 104, . . . are formed which are to be connected with electrode terminals formed in the vicinity of the edge of the semiconductor element 102.

From these pads 104, 104, . . . , wiring patterns 108 are drawn out to via pads 106 formed in the vicinity of the edge of the semiconductor element loading face outside the semiconductor element 102 to be loaded, respectively.

In contrast to such a semiconductor element loading face, on the backside of the wiring board 100, as shown in FIG. 12B, external connecting pads 114, 114, . . . are arranged in a lattice pattern. The via pads 106, 106, . . . are connected to pads 110 through vias passing through the wiring board 100 and further connected to the corresponding external connecting pads 114 through wiring patterns 112.

Meanwhile, in recent years, with development of high performance and miniaturization, the electrode terminals of the semiconductor element has been formed with high density. Namely, as shown in FIG. 10, electrode terminals 202, 202, have become formed on the entire face of the one side of the semiconductor element 200.

In the wiring board on which a semiconductor element 200 is to be loaded, as shown in FIG. 10, on the semiconductor element loading face, the loading pads corresponding to the electrode terminals 202, 202, . . . of the semiconductor element 200 must be formed, and the wiring patterns 108 must be also drawn from the loading pads to the via pads 106 formed in the vicinity of the edge of the wiring board, respectively.

However, the pitch between the loading pads corresponding to the electrode terminals 202, 202, of the semiconductor element 200 is so narrow that the number of the wiring patterns capable of being formed between the loading pads is limited. As a result, with the wiring board being formed of multiple layers, the wiring patterns which cannot be formed must be drawn to the via pads 106.

The following Patent Reference 1 discloses a semiconductor device in which the semiconductor element 200 with the electrode terminals 202, 202, . . . formed on the entire surface of the one side is loaded on the board with the wiring board being not formed of multiple layers.

FIG. 11 shows such a semiconductor device. In the semiconductor device shown in FIG. 11, the electrode terminals 202, 202, . . . of the semiconductor element 200 are electrically connected with the corresponding external connecting terminals 206, 206 formed on a board 204 through soldering bumps 208, respectively.

[Patent Reference 1] JP-A-10-284538

In the semiconductor device shown in FIG. 11, without routing the wiring patterns on the board, the electrode terminals 202, 202, . . . of the semiconductor element 200 are electrically connected with the corresponding external connecting terminals 206, respectively.

In the semiconductor device shown in FIG. 11, however, the external connecting terminals 206 of the board 204 are formed immediately below the electrode terminals 202 of the semiconductor element 200 so that the pitch between the electrode terminals 202, 202, . . . of the semiconductor element 200 is equal to that between the external connecting terminals 206, 206, . . . of the board 204. Owing to this fact, the number of the external connecting terminals 206 capable of being formed at the board 204 will be limited.

Further, it is required that the pitch between the external connecting terminals 206, 206, . . . formed on the board 204 is changed in the relationship with the mounting pads of a mounting board in which the semiconductor device is mounted.

However, it is very difficult to satisfy this requirement in the semiconductor device shown in FIG. 11 because the pitch between the electrode terminals 202, 202, of the semiconductor element 200 must be first changed.

SUMMARY OF THE INVENTION

In view of the above circumstance, an object of this invention is to provide a wiring board, a semiconductor device and a semiconductor element capable of solving the problem of a conventional semiconductor device in which the number of the external connecting terminals capable of being formed on a wiring board is limited and the pitch between the external connecting terminals is difficult to change; solving the problem of limitation of the number of the external connecting terminals capable of being formed on the wiring board; and easily changing the pitch between the external connecting terminals.

The inventors have investigated in order to solve the above problems, and found out that the number of the wiring patterns formed on the semiconductor element loading face can be minimized and external connecting terminals can be formed on the entire face of the other side of the wiring board by providing, on a semiconductor element loading face formed on the one side of the wiring board and having a wider area than that of the semiconductor element, both of via pads formed in the vicinity of the edge of the semiconductor element loading face, and also areas pads constructed of the loading pads corresponding to electrode terminals formed in the central region of the semiconductor element and its vicinity, the via pads and the area pads being connected with each other from the loading pads corresponding to the electrode terminals formed at the edge of the semiconductor element through wiring patterns; and by electrically connecting each of the area pads to the external connecting terminal pads formed on the other side of the wiring board, respectively through the nearest area pad vias encircled by the external connecting terminal pads and passing through the wiring board and the wiring patterns.

According to a first aspect of this invention, there is provided a wiring board for a semiconductor device in which a semiconductor element with electrode terminals formed on the entire face of one side of the wiring board, wherein on a semiconductor element loading face formed on the one side of the wiring board and having an area wider than an area of the semiconductor element, the wiring board including:

wiring patterns which are drawn out from loading pads formed in the vicinity of the edge of the semiconductor element in the loading pads formed so as to correspond to the electrode terminals formed on the semiconductor element, respectively and connected to via pads formed in the vicinity of the edge of the semiconductor element loading face;

area pads constructed of the loading pads corresponding to the electrode terminals formed in a central region of the semiconductor element and a vicinity of the central region, which are electrically connected to external connecting terminal pads formed in a lattice pattern in a central region on the other side of the wiring board and a vicinity of the central region so as to correspond to the area pads, respectively through the nearest area pad vias encircled by the external connecting terminal pads formed in a lattice pattern and passing through the wiring board and the wiring patterns; and a plurality of the loading pads constituting the area pads commonly use one of the area pad vias.

According to a second aspect of this invention, there is provided the wiring board according to the first aspect, wherein the one end of each the area pad vias is directly connected to each the external connecting terminal pads.

Thereby, the connecting distance between the loading pad and the corresponding external connecting terminal pad can be further shortened.

According to a third aspect of this invention, there is provided the wiring board according to the first or second aspect, wherein the wiring board is formed of a single insulative layer with top and bottom conductive layers.

According to a forth aspect of this invention, there is provided the wiring board according to any one of the first to third aspects, wherein the plurality of loading pads constituting the area pads commonly using the one area pad via are power supply pads or grounding pads.

Thereby, the correcting distance between the power supply pad or grounding pad and the corresponding external connecting terminal pad can be shortened to the utmost.

According to a fifth aspect of this invention, there is provided the wiring board according to any one of the first to forth aspects, wherein the loading pads connected to the via pads through the wiring patterns are signal electrode pads.

Thereby, the power supply pads or grounding pads can be concentrated in the central region of the wiring board and its vicinity.

According to a sixth aspect of this invention, there is provided a semiconductor device, wherein the semiconductor element is loaded on the semiconductor element loading face of the wiring board according to any one of the first to fifth aspects.

According to a seventh aspect of this invention, there is provided the semiconductor device according to the sixth aspect, wherein one or both of power supply electrode terminals and grounding electrode terminals are mainly mixedly formed in a central region of the semiconductor element, and signal electrode terminals are mainly formed at an edge of the semiconductor element.

According to an eighth aspect of this invention, there is provided the semiconductor element loaded on the semiconductor element loading face of the wiring board according to any one of the first to fifth aspects, wherein one or both of power supply electrode terminals and grounding electrode terminals are mainly mixedly formed in a central region of the semiconductor element, and signal electrode terminals are mainly formed at an edge of the semiconductor element.

According to a ninth aspect of this invention, there is provided the wiring board according to the first aspect, wherein the wiring board is formed of a multi layer thereof.

In the wiring board according to this invention, by providing both of the area pads and via pads on the semiconductor element loading face, the semiconductor element with the electrode terminals on the entire face of the one side thereof can be easily loaded thereon. Specifically, the electrode terminals formed at the center region of the semiconductor element and its vicinity can be connected to the loading pads constituting the area pads of the wiring board while the electrode terminals formed in the vicinity of the edge of the semiconductor element can be connected to the loading pads connected to the via pads through the wiring patterns.

The loading pads of these area pads are connected respectively to the corresponding external connecting terminal pads formed on the other side of the wiring board through vias passing through the wiring board. Further, since the via pads are formed in the vicinity of the edge of the wiring board, they may be connected to the external connecting terminal pads formed on the other side of the wiring board through the vias passing through the wiring board, or may be connected to predetermined points of e.g. a mounting board through wire bonding.

In this way, on the entire face of the other side of the wiring board having a wider area than that of the semiconductor element to be loaded, the necessary number of external connecting terminal pads can be formed. Thus, limitation of the number of the external connecting terminals which can be formed on the wiring board can be cancelled and the pitch between the external connecting terminals can be easily charged.

In addition, in this invention, the loading pads constituting the area pads of the wiring board are electrically connected to the external connecting terminal pads formed in a lattice pattern in the central region of the other side of the wiring board and its vicinity through the nearest area pad vias passing through the wiring board encircled by the external connecting terminal pads and the wiring patterns; and further the plurality of loading pads constituting the area pads commonly use one of the area pad vias. Thus, the connecting distance between the loading pads constituting the area pads and the corresponding external connecting terminal pads can be shortened to the utmost so that when the loading pads are used as the power supply pads, changes in a voltage can be prevented.

BRIEF DESCRIPTION OF THE DRAWINGS

FIG. 6 is a view for explaining still another example of the arrangement situation of loading pads 22 formed in the central region of a wiring board 20 and its vicinity shown in FIG. 1, area pad vias 30 and external connecting terminal pads 28.

FIGS. 7A and 7B are partially perspective views for explaining the state where the loading pad 22 and external connecting terminal pad 28, shown in FIG. 6 are connected to each other.

DETAILED DESCRIPTION OF THE PREFERRED EMBODIMENTS

Figure 1A:
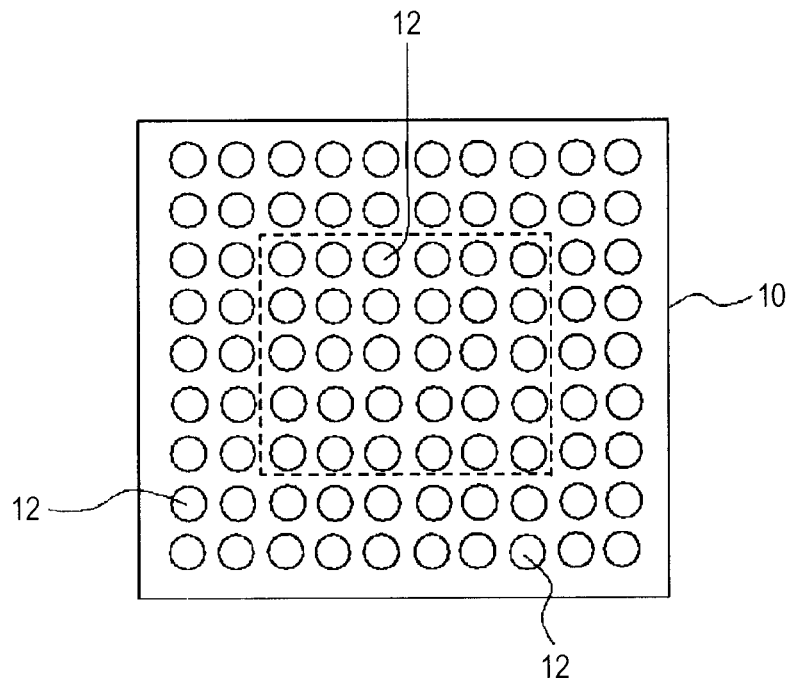
FIGS. 1A and 1B are front views for explaining an example of the semiconductor element and wiring board according to this invention.

An example of a semiconductor element to be loaded on a wiring board according to this invention is shown in FIG. 1A. In the semiconductor element 10 shown in FIG. 1A, electrode terminals 12, 12, ... are formed on the entire surface of its one side. Of these electrode terminals 12, 12, ... , the electrode terminals 12, 12 formed in the central region encircled by a dotted line and its vicinity are mainly those for power supply and for grounding.

Further, the electrode terminals 12, formed in two rows on the edge side of the semiconductor element 10 (outside the dotted line) are mainly those for signals.

Figure 1B:
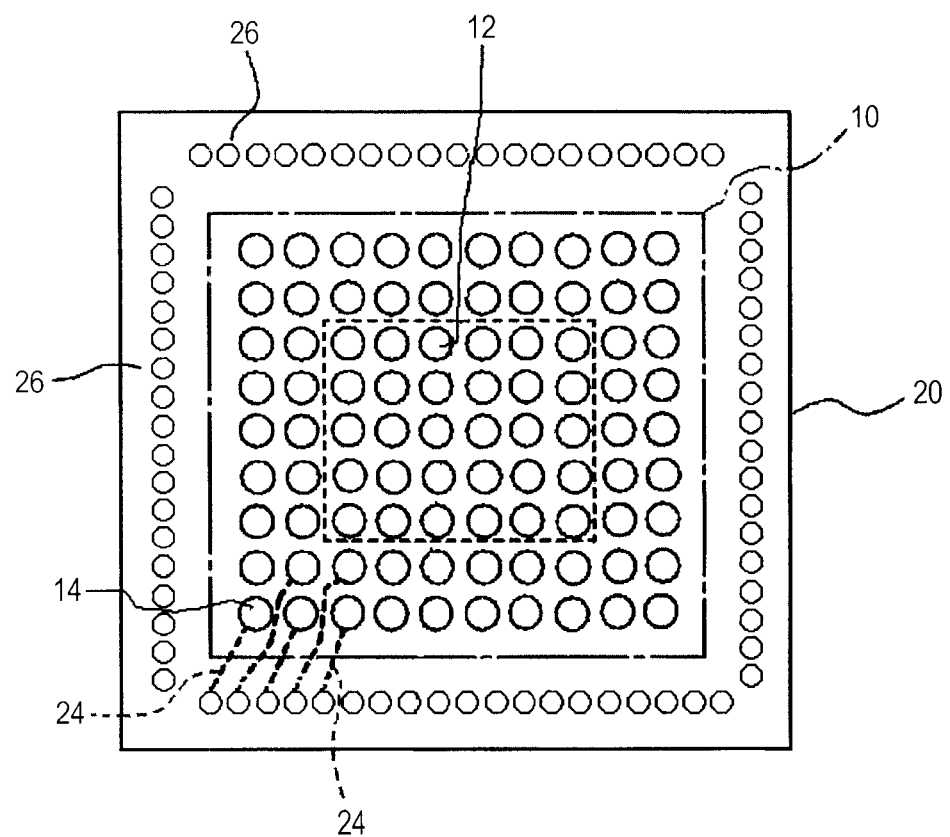

The wiring board 20 shown in FIG. 1B on which the above semiconductor element 10 is loaded is formed of a resin board of a single layer. A semiconductor element loading face is formed on the one side of the wiring board 20, and as seen form FIG. 1B, it has a wider area than that of the semiconductor element 10. On the semiconductor element loading face, formed are loading pads 22 corresponding to the electrode terminals 12, 12, ... formed on the semiconductor element 10, respectively.

Of these loading pads 22, 22, ... , the loading pads 22, 22, ... formed in the central region encircled by a dotted line and its vicinity are area pads to be connected to the electrode terminals 12, 12, ... composed mainly of electrode terminals for power supply and electrode terminals for grounding.

Further, the loading pads 22, 22, ... formed in two rows on the edge side of the wiring board 20 (outside the dotted line) will be connected to the electrode terminals 12, 12, ... of mainly those for signals ... formed in two rows on the edge side of the semiconductor element 10.

From the loading pads 22, 22, ... formed in two rows on the edge side of the wiring board 20, wiring patterns 24 formed on the one side of the wiring board 20 are drawn out and connected to via pads 26 formed in the vicinity of the edge of the wiring board 20. The wiring patterns 24 must be drawn between the loading pads 22, 22, ... formed on the outermost side; but usually, there is a gap sufficient to form a single wiring pattern 24 bet between the loading pads 22, 22.

Further, as seen from FIG. 1B, the via pads 26, 26, ... are formed at the positions outside the semiconductor element 10 to be loaded and in the vicinity of the edge of the wiring board 20.

As described above, since the via pads 26, 26, ... are formed in the vicinity of the edge of the semiconductor element 10 to be loaded, there is great flexibility in the connection between the via pads 26, 26, ... and other pads. For example, the via pads 26, 26, ... can be connected through vias passing through the wiring board 20 to the external connecting pads formed on the other side of the wiring board 20. Otherwise, predetermined points of a mounting board for mounting the wiring board 20 can be connected to the via pads 26, 26, ... through wire bonding, respectively.

In the wiring board 20 shown in FIG. 1B, the loading pads 22, 22, ... formed in two rows on the edge side of the wiring board 20 are connected to the via pads 26 formed in the vicinity of the edge of the wiring board 20. For this reason, on the other side of the wiring board 20, over the entire face of the area corresponding to the loading face on which the semiconductor element 10 is loaded (area encircled by one-dot chain line in FIG. 1B), pads for external connecting terminals (external connecting terminal pads) can be formed which correspond to area pads of the loading pads 22, 22, ... formed in the ventral region on the one side of the wiring board 20 and its vicinity (area encircled by a dotted line). Thus, it is possible to form the necessary number of the external connecting terminal pads for the semiconductor element 10 to be loaded and easily deal with changes in the pitch between the external connecting terminals.

Figure 2:
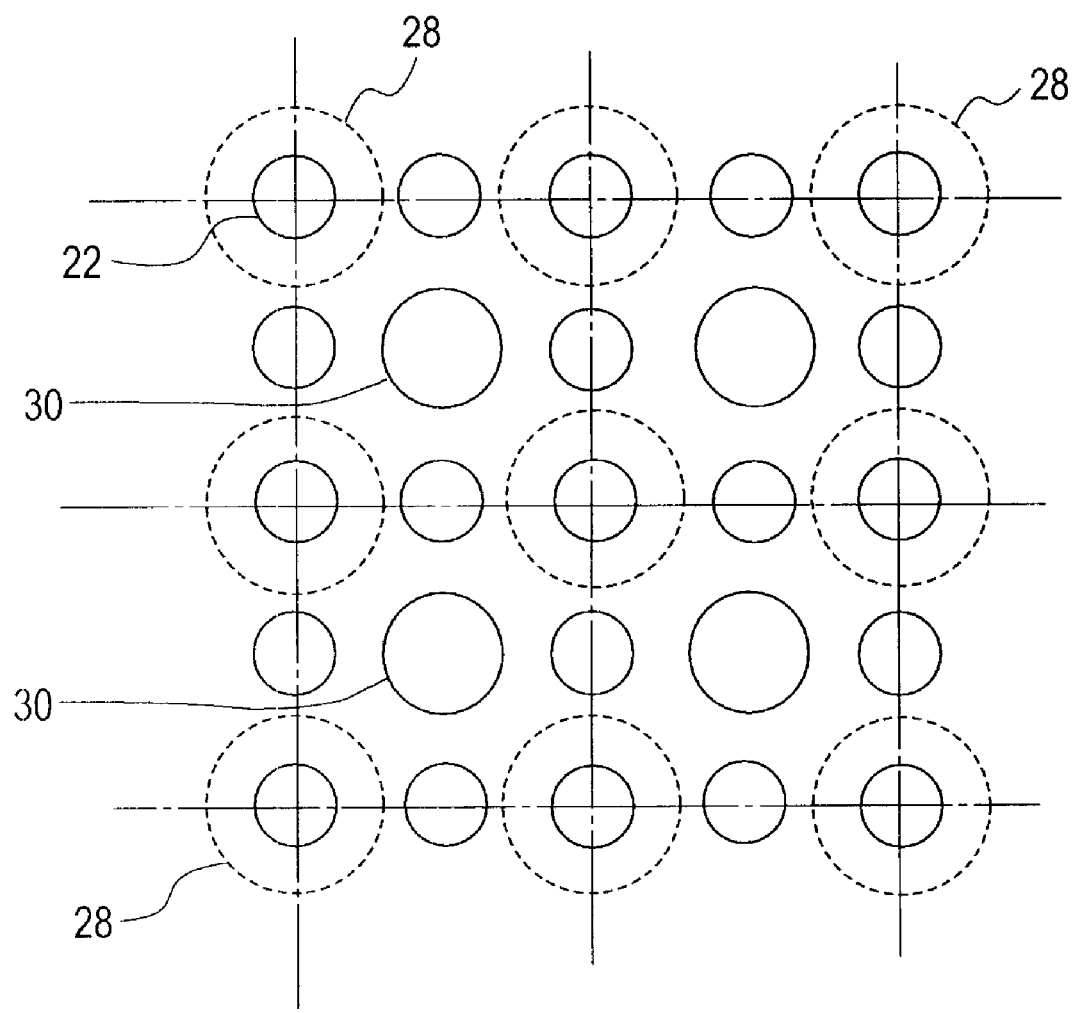
FIG. 2 is a view for explaining an example of the arrangement situation of loading pads 22 formed in the central region of a wiring board 20 and its vicinity shown in FIG. 1, area pad vias 30 and external connecting terminal pads 28.

These external connecting terminal pads, as shown in FIG. 2, are formed in a lattice pattern on the other side of the wiring board 20.

Vias 30 for area pads (area pad vias 30), formed in the vicinity of the central region of the area encircled by the external connecting terminal pads 28, 28 ... formed in a lattice pattern and passing through the wiring board 20, are connected to the loading pads 22 constituting the nearest area pads through the wiring patterns. In the wiring board 20 shown in FIG. 2, the loading pads 22 are formed on the one side of the wiring board 20 so as to correspond to the external connecting terminal pads 28 formed on the other side of the wiring board 20. Further, also at the positions located between the external connecting terminal pads 28, 28 for, the loading pads 22 are formed.

Figure 3A:
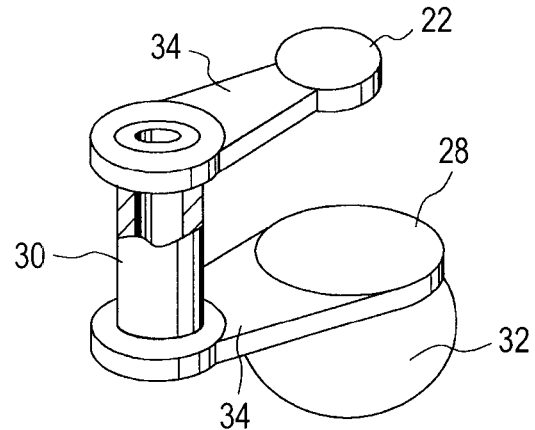
FIGS. 3A to 3C are partially perspective views for explaining the state where the loading pad 22 and external connecting terminal pad 28, shown in FIG. 2 are connected to each other.
Figure 3B:
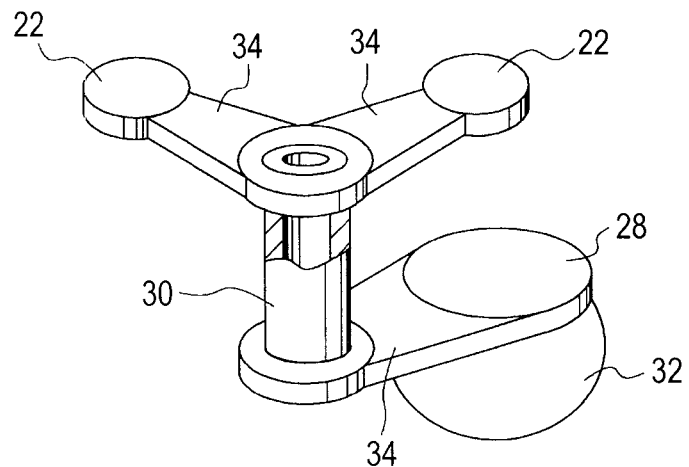
Figure 3C:
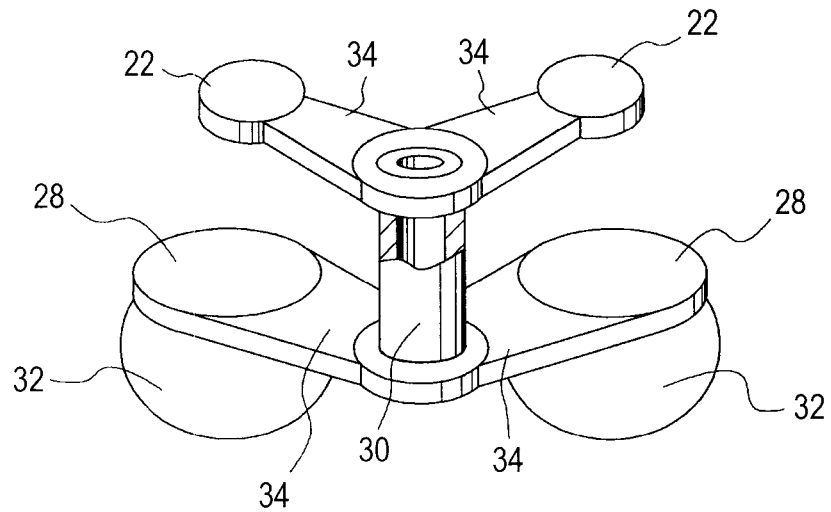

The state where these loading pads 22 and the external connecting terminal pads 28 for are connected with each other is shown in FIGS. 3A to 3C. FIG. 3A shows the state where the loaning pad 22 and external connecting terminal pad 28 are connected to each other in one-to-one correspondence. The loading pad 22 formed on the one side of the wiring board 20 so as to correspond to the external connecting terminal pad 28 formed on the other side of the wiring board 20 is connected to the one end of the nearest area pad via 30 through the wiring pattern 34 formed on the one side of the wiring board 20. The area pad via 30 is a through-hole via whose other end is connected to the external connecting terminal pad 28 through the wiring pattern 34 formed on the other side of the wiring board 20. The external connecting terminal pad 28 is covered with an external connecting terminal of a solder ball 32.

In this way, the loading pad 22 constituting the area pad is permitted to shorten the connecting distance to the external connecting terminal pad 28 to the utmost by the nearest area pad via 30.

The loading pads 22, 22, . . . constituting the area pads are connected to the electrode terminals which are mainly the power supply terminals and grounding terminals of the semiconductor element 10. Therefore, as the case may be, both of the adjacent loading pads 22, 22 are the loading pads connected to the power supply terminals or the grounding terminals of the semiconductor element 10. In this case, as shown in FIG. 3B, the loading pads 22, 22 can commonly use a single area pad via 30. By commonly using the single area pad via 30, the number of the area pad vias 30 and also the number of the external connecting terminal pads 28 can be reduced.

Further, as shown in FIG. 3C, the loading pads 22, 22 and external connecting terminal pad 28, 28 may commonly use the single area pad via 30.

It should be noted that the wiring board 20 may have three kinds of connecting types of FIGS. 3A, 3B and 3C.

When the semiconductor element 10 shown in FIG. 1A is loaded on the semiconductor element loading face of the wiring board 23 shown in FIG. 1B thereby to obtain the semiconductor device, the power supply electrode terminals or grounding electrode terminals formed in the central region of the semiconductor element 10 and its vicinity are connected to the loading pads 22, 22, . . . constituting the area pads of the wiring board 20.

The connecting distance between each of the loading pads 22, 22, . . . of these area pads and the corresponding external connecting terminal pad 28, as shown in FIGS. 2 and 3, can be shortened to the utmost. For this reason, in the semiconductor device thus obtained, changes in the voltage supplied from the power supply terminal can be prevented to utmost so that the performance of the semiconductor device can be improved.

Figure 4:
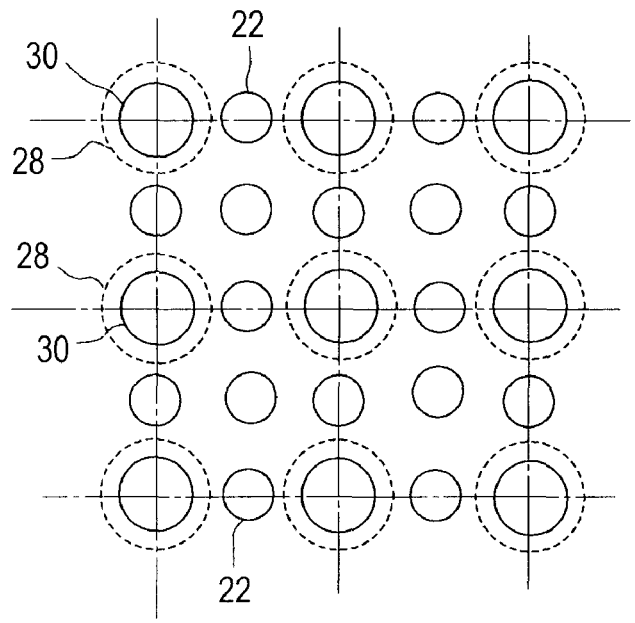
FIG. 4 is a view for explaining another example of the arrangement situation of loading pads 22 formed in the central region of a wiring board 20 and its vicinity shown in FIG. 1, area pad vias 30 and external connecting terminal pads 28.
Figure 5A:
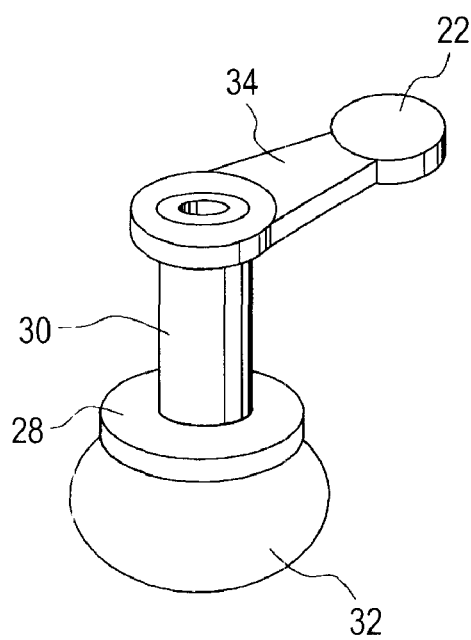
FIGS. 5A and 5B are partially perspective views for explaining the state where the loading pad 22 and external connecting terminal pad 28, shown in FIG. 4 are connected to each other.
Figure 5B:
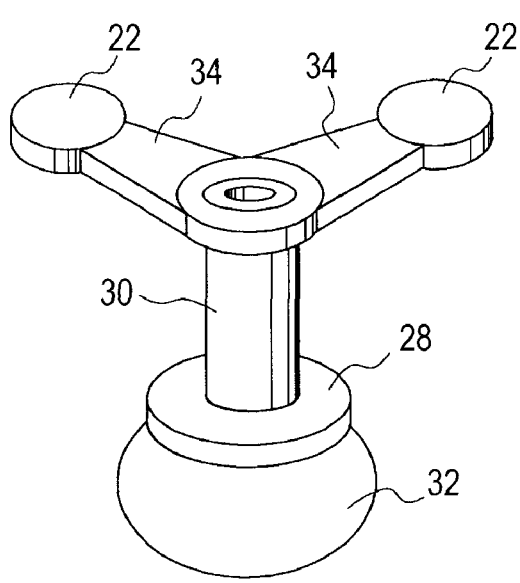

The area pad vias 30 shown in FIGS. 2 and 3 are formed in the vicinity of the central region of the area encircled by the external connecting terminal pads 28, 28, . . . formed in a lattice pattern. However, as shown in FIG. 4, the area pad vias 30 may be directly connected to the external connecting terminal pads 28, 28, . . . , respectively. The state where the loading pad 22 and external connecting terminal pad 28, shown in FIG. 4 are connected to each other is shown in FIG. 5. FIG. 5A shows the state where the loading pad 22 and external connecting terminal pad 28 are connected to each other in one-to-one correspondence. FIG. 5B shows the state where the loading pads 22, 22 commonly use the single area pad via 30.

The connecting distance between the loading pad 22 and the corresponding external connecting terminal pad 28, shown in FIGS. 4 and 5 can be more greatly shortened than that between the loading pad 22 and the corresponding external connecting terminal pad 28, shown in FIGS. 2 and 3.

In the wiring board 20 shown in FIGS. 2 to 5, the one end of the area pad via 30 being the through-hole via is hollow at the center. As shown in FIG. 6, each of the loading pads 22, 22, . . . may be directly connected to the one end of the area pad via 30. The state where the loading pad 22 and external connecting terminal pad 28, shown in FIG. 6 are connected to each other is shown in FIG. 7. FIG. 7A shows the state where the loading pad 22 and external connecting terminal pad 28 are connected to each other in one-to-one correspondence. FIG. 7B shows the state where the loading pads 22, 22 commonly use the single external connecting terminal pad 28.

In such as a manner that the area pad via 30 is solid at the center, at both ends of the area pad via 30, the loading pad 22 and external connecting terminal pad 28 can be easily formed.

As shown in FIG. 7, each of the loading pads 22, 22, . . . is directly connected to the one end of the area pad via 30. In addition, the other end of the area pad via 30 is connected to each of the external connecting terminal pads 28, 28, . . . . For this reason, the connecting distance between the loading pad 22 and external connecting terminal pad 28 can be shortened to the maximum.

Figure 8:
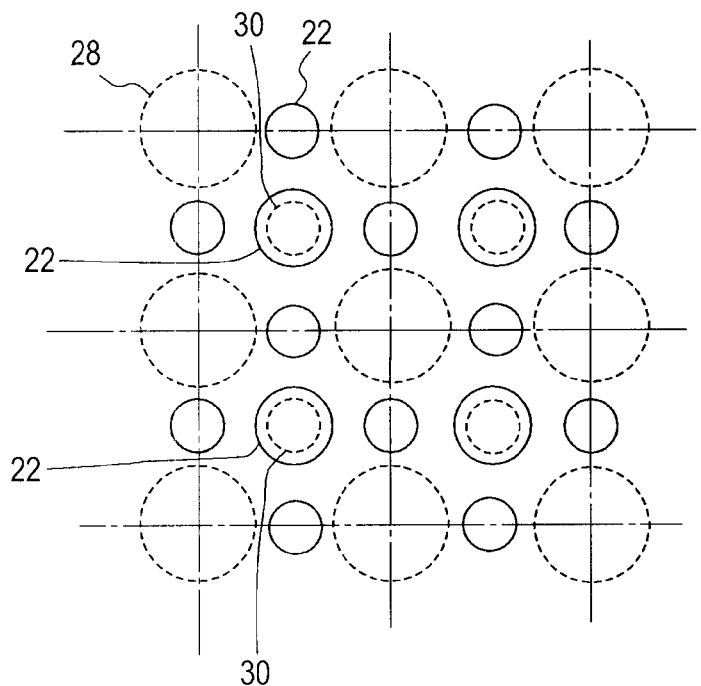
FIG. 8 is a view for explaining a further example of the arrangement situation of loading pads 22 formed in the central region of a wiring board 20 and its vicinity shown in FIG. 1, area pad vias 30 and external connecting terminal pads 28.
Figure 9A:
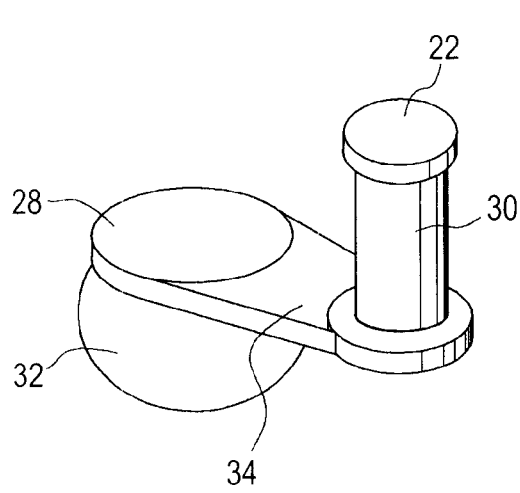
FIGS. 9A and 9B are partially perspective views for explaining the state where the loading pad 22 and external connecting terminal pad 28, shown in FIG. 8 are connected to each other.
Figure 9B:
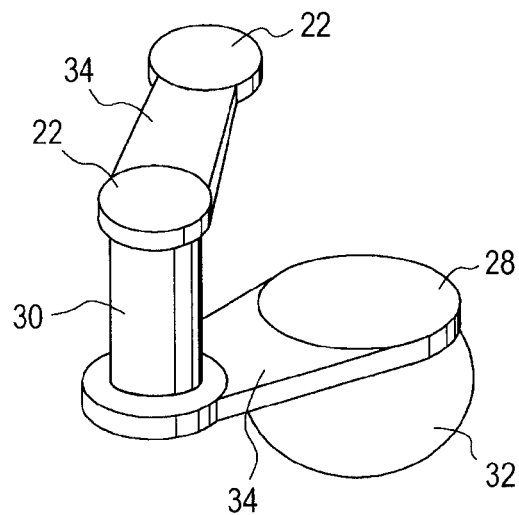
Figure 10:
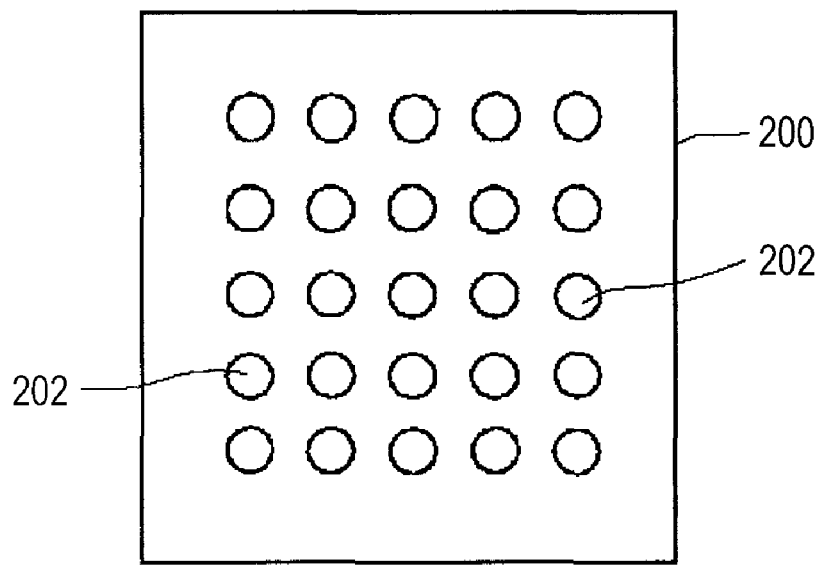
FIG. 10 is a front view for explaining a conventional semiconductor element.
Figure 11:
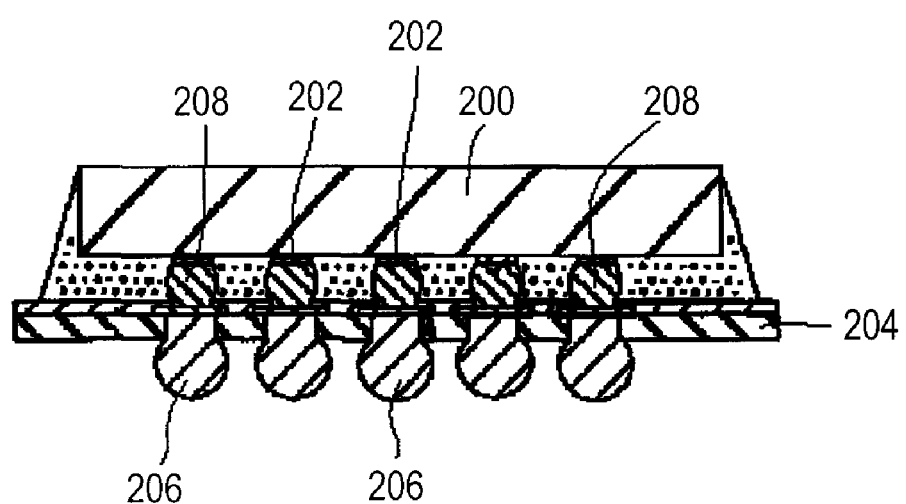
FIG. 11 is a longitudinal sectional view for a semiconductor device on which the semiconductor element shown in FIG. 10 is loaded.
Figure 12A:
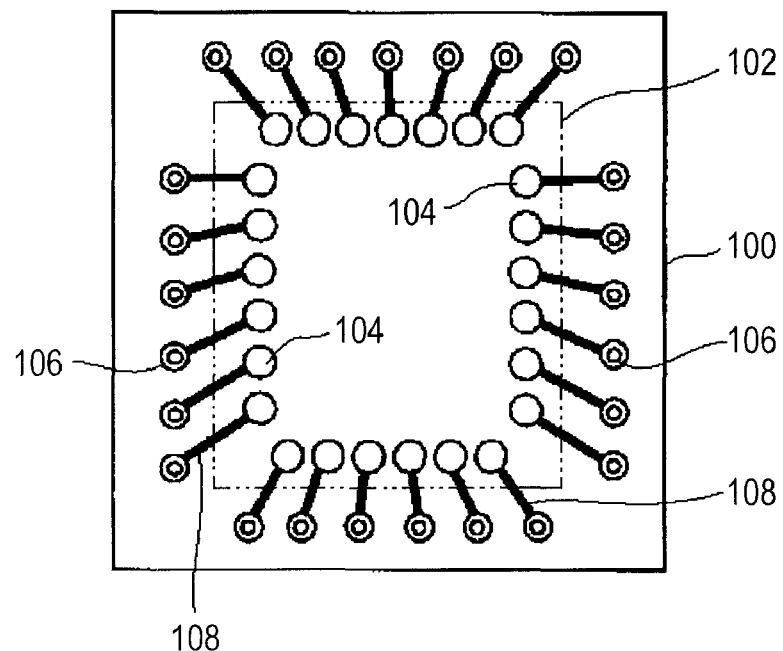
FIGS. 12A and 12B are a front view and a rear view for explaining a conventional wiring board.
Figure 12B:
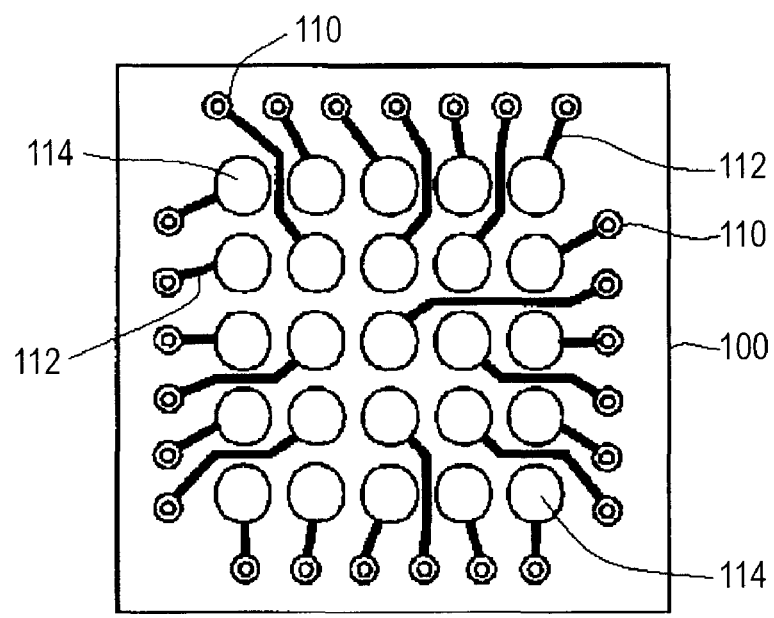

As shown in FIGS. 6 and 7, where it is difficult that the loading pad 22 and external connecting terminal pad 28 are formed at both ends of the area pad via 30, the external connecting terminal pad 28 may be connected to the one end of the area pad via 30 formed in the central region encircled by the external connecting terminal pads 28, 28, . . . arranged in a lattice pattern as shown in FIG. 8. In this case, it is not necessary to form the loading pad 22 on the semiconductor element loading face of the wiring board 20 corresponding to the external connecting terminal pads 28, 28, . . . . The state where the loading pad 22 and external connecting terminal pad 28, shown in FIG. 8 are connected to each other is shown in FIG. 9. FIG. 9A shows the state where the loading pad 22 and external connecting terminal pad 28 are connected to each other in one-to-one correspondence. FIG. 9B shows the state where the loading pads 22, 22 commonly use the single external connecting terminal pad 28.

What is claimed is:

1. A wiring board for a semiconductor device in which a semiconductor element with electrode terminals formed on the entire face of one side of the wiring board, wherein on a semiconductor element loading face formed on the one side of the wiring board and having an area wider than an area of the semiconductor element, the wiring board comprising:
wiring patterns which are drawn out from loading pads formed in the vicinity of the edge of the semiconductor element in cue loading pads formed so as to correspond to the electrode terminals formed on the semiconductor element, respectively and connected to via pads formed in the vicinity of the edge of the semiconductor element loading face;

area pads constructed of the loading pads corresponding to the electrode terminals formed in a central region of the semiconductor element and a vicinity of the central region, which are electrically connected to external connecting terminal pads formed in a lattice pattern in a central region on the other side of the wiring board and a vicinity of the central region so as to correspond to the area pads, respectively through area pad vias encircled by the external connecting terminal pads formed in a lattice pattern and passing through the wiring board and the wiring patterns; and a plurality of the loading pads constituting the area pads commonly use one of the area pad vias.

2. The wiring board according to claim 1, wherein the one end of each the area pad vias is directly connected to each the external connecting terminal pads.

3. The wiring board according to claim 1, wherein the wiring board is formed of a single insulative layer with top and bottom conductive layers.

4. The wiring board according to claim 1, wherein the plurality of loading pads constituting the area pads commonly using the one area pad via are power supply pads or grounding pads.

5. The wiring board according to claim 1, wherein the loading pads connected to the via pads through the wiring patterns are signal electrode pads.

6. A semiconductor device, wherein the semiconductor element is loaded on the semiconductor element loading face of the wiring board according to claim 1.

7. The semiconductor device according to claim 6, wherein one or both of power supply electrode terminals and grounding electrode terminals are mainly mixedly formed in a central region of the semiconductor element, and signal electrode terminals are mainly formed at an edge of the semiconductor element.

8. The semiconductor element loaded on the semiconductor element loading face of the wiring board according to claim 1, wherein one or both of power supply electrode terminals and grounding electrode terminals are mainly mixedly formed in a central region of the semiconductor element, and signal electrode terminals are mainly formed at an edge of the semiconductor element.

9. The wiring board according to claim 1, wherein the wiring board is formed of a multi layer thereof.

* * * * *

UNITED STATES PATENT AND TRADEMARK OFFICE
CERTIFICATE OF CORRECTION

PATENT NO. : 7,884,463 B2  Page 1 of 1
APPLICATION NO. : 12/626037
DATED : February 8, 2011
INVENTOR(S) : Takashi Ozawa et al.

It is certified that error appears in the above-identified patent and that said Letters Patent is hereby corrected as shown below:

On the title page item [30] insert

--Foreign Application Priority Data

November 25, 2008 (JP)    2008-299052
November 19, 2009 (JP)    2009-264216--

Signed and Sealed this
Twenty-seventh Day of December, 2011

David J. Kappos
*Director of the United States Patent and Trademark Office*